US012726175B2

(12) United States Patent
Daimon

(10) Patent No.: US 12,726,175 B2
(45) Date of Patent: Sep. 1, 2026

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 855 days.

(21) Appl. No.: 18/113,228

(22) Filed: Feb. 23, 2023

(65) Prior Publication Data

US 2023/0208391 A1 Jun. 29, 2023

Related U.S. Application Data

(63) Continuation of application No. PCT/JP2021/031896, filed on Aug. 31, 2021.

(30) Foreign Application Priority Data

Sep. 3, 2020 (JP) ................................ 2020-148279

(51) Int. Cl.
*H03H 9/13* (2006.01)
*H03H 9/17* (2006.01)

(52) U.S. Cl.
CPC ............. *H03H 9/13* (2013.01); *H03H 9/176* (2013.01)

(58) Field of Classification Search
CPC ...... H03H 9/13; H03H 9/176; H03H 9/02535; H03H 9/02559
USPC ...... 310/313 R, 313 A, 313 B, 313 C, 313 D
See application file for complete search history.

(56) References Cited

U.S. PATENT DOCUMENTS 5,998,907 A * 12/1999 Taguchi ............. H03H 9/02921 310/357
2001/0035695 A1 11/2001 Kadota et al.
2008/0042517 A1 2/2008 Stokes et al.
2012/0274184 A1 11/2012 Stephanou et al.
2013/0234805 A1 9/2013 Takahashi
2013/0285768 A1 10/2013 Watanabe et al.
2017/0272049 A1 9/2017 Kawachi et al.
2018/0301616 A1 10/2018 Kimura et al.
(Continued)

FOREIGN PATENT DOCUMENTS

CN 102946236 A 2/2013
JP 2002026687 A 1/2002
JP 2008048379 A 2/2008
(Continued)

OTHER PUBLICATIONS

Official Communication issued in corresponding Chinese Patent Application No. 202180052339.4, mailed on Jun. 5, 2025, 6 pages.
(Continued)

*Primary Examiner* — Derek J Rosenau
(74) *Attorney, Agent, or Firm* — Keating & Bennett, LLP

(57) ABSTRACT

An acoustic wave device includes a support substrate, a piezoelectric film on the support substrate, and an IDT electrode on the piezoelectric film. A film thickness of the piezoelectric film is equal to or less than about 1λ when λ is a wavelength of an acoustic wave determined by an electrode finger period of the IDT electrode. The piezoelectric film includes first and second regions in a thickness direction of the piezoelectric film. A first density that is a density in the first region and a second density that is a density in the second region are different from each other.

20 Claims, 6 Drawing Sheets

(56) References Cited

U.S. PATENT DOCUMENTS

2019/0386639 A1 12/2019 Iwamoto

FOREIGN PATENT DOCUMENTS

| | | | |
|---|---|---|---|
| JP | 2012530388 | A | 11/2012 |
| JP | 2013214954 | A | 10/2013 |
| JP | 2015073331 | A | 4/2015 |
| JP | 2018182615 | A | 11/2018 |
| JP | 2019220794 | A | 12/2019 |
| KR | 20170108842 | A | 9/2017 |

OTHER PUBLICATIONS

International Search Report in PCT/JP2021/031896, mailed Nov. 9, 2021, 3 pages.
Written Opinion in PCT/JP2021/031896, mailed Nov. 9, 2021, 4 pages.

* cited by examiner

ACOUSTIC WAVE DEVICE

CROSS REFERENCE TO RELATED APPLICATIONS

This application claims the benefit of priority to Japanese Patent Application No. 2020-148279 filed on Sep. 3, 2020 and is a Continuation Application of PCT Application No. PCT/JP2021/031896 filed on Aug. 31, 2021. The entire contents of each application are hereby incorporated herein by reference.

BACKGROUND OF THE INVENTION

1. Field of the Invention

The present invention relates to an acoustic wave device used in an acoustic wave resonator and an acoustic wave filter.

2. Description of the Related Art

Japanese Unexamined Patent Application Publication No. 2015-73331 discloses an acoustic wave device having a piezoelectric film made of a $LiTaO_3$. In this acoustic wave device, a low acoustic velocity film and a piezoelectric film are stacked on a high acoustic velocity support substrate. An IDT electrode is provided on the piezoelectric film. In the above-described structure, a film thickness of the piezoelectric film is in a range from 0.05λ to 0.5λ when λ is a wavelength determined by an electrode period of the IDT electrode. Thereby, a Q value can be increased.

As in the acoustic wave device described in Japanese Unexamined Patent Application Publication No. 2015-73331, when a surface acoustic wave is utilized and the film thickness of the piezoelectric film is relatively small, a spurious response occurs outside a band in some cases. When this acoustic wave device is used in a band-pass acoustic wave filter, filter characteristics deteriorate in some cases.

SUMMARY OF THE INVENTION

Preferred embodiments of the present invention provide acoustic wave devices that are each able to reduce or prevent an out-of-band spurious response.

A preferred embodiment of the present invention provides an acoustic wave device including a support substrate, a piezoelectric film on the support substrate, and an IDT electrode on the piezoelectric film, wherein a film thickness of the piezoelectric film is equal to or less than about 1λ when λ is a wavelength of an acoustic wave determined by an electrode finger period of the IDT electrode, the piezoelectric film includes a first region and a second region in a thickness direction of the piezoelectric film, and when a density in the first region is a first density and a density in the second region is a second density, the first density and the second density are different from each other.

A preferred embodiment of the present invention provides an acoustic wave device including a support substrate, a piezoelectric film on the support substrate, and an IDT electrode on the piezoelectric film, wherein a film thickness of the piezoelectric film is, when λ is a wavelength of an acoustic wave determined by an electrode finger period of the IDT electrode, equal to or less than about 1λ, the piezoelectric film includes a first piezoelectric film and a second piezoelectric film stacked directly or indirectly on the first piezoelectric film, the first piezoelectric film and the second piezoelectric film are made of piezoelectric materials of the same system, and when a density of the first piezoelectric film is a first density and a density of the second piezoelectric film is a second density, the first density and the second density are different from each other.

According to preferred embodiments of the present invention, it is possible to provide acoustic wave devices that are each able to reduce or prevent an out-of-band spurious response.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

It should be pointed out that each preferred embodiment described in the present specification is merely illustrative and configurations can be partially replaced or combined between different preferred embodiments.

Figure 1A:
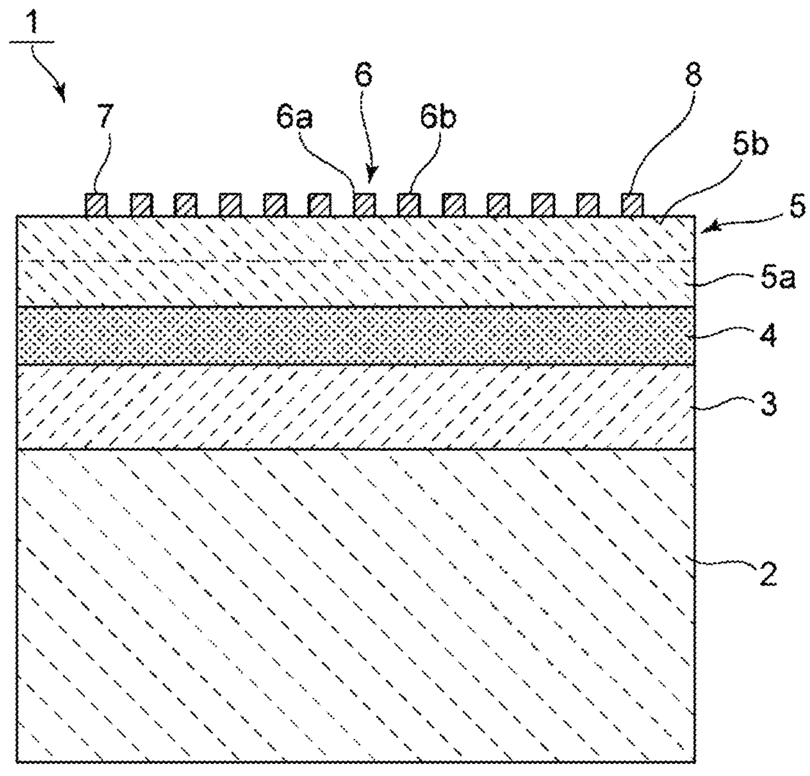
FIGS. 1A and 1B are a front sectional view of an acoustic wave device according to a first preferred embodiment of the present invention and a schematic plan view illustrating an electrode structure thereof, respectively.
Figure 1B:
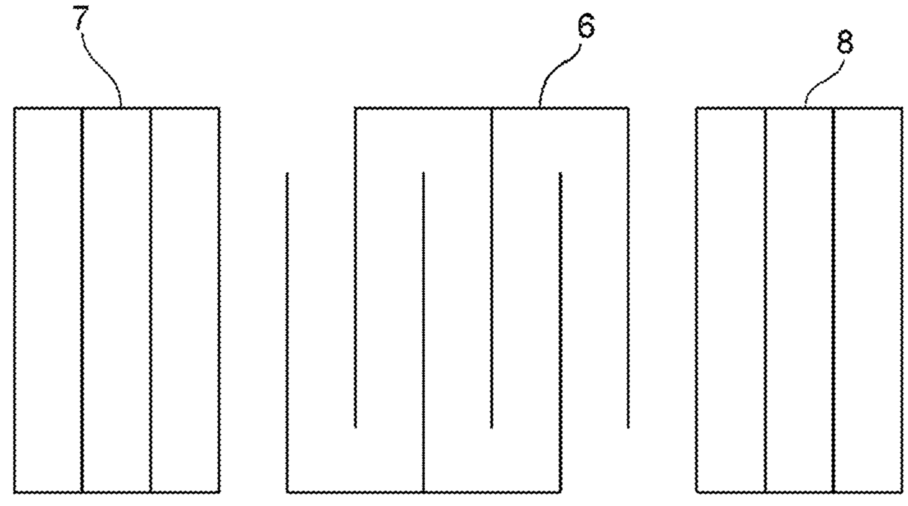

FIG. 1A is a front sectional view of an acoustic wave device according to a first preferred embodiment of the present invention, and FIG. 1B is a schematic plan view illustrating an electrode structure thereof.

An acoustic wave device 1 has a support substrate 2. A high acoustic velocity material layer 3, a low acoustic velocity material layer 4, and a piezoelectric film 5 are stacked in this order on the support substrate 2. That is, the piezoelectric film 5 is indirectly provided on the support substrate 2. An IDT electrode 6 and reflectors 7 and 8 are provided on the piezoelectric film 5. A protective film made of, for example, silicon oxide or the like may be provided so as to cover the piezoelectric film 5, the IDT electrode 6, and the reflectors 7 and 8.

Figure 2:
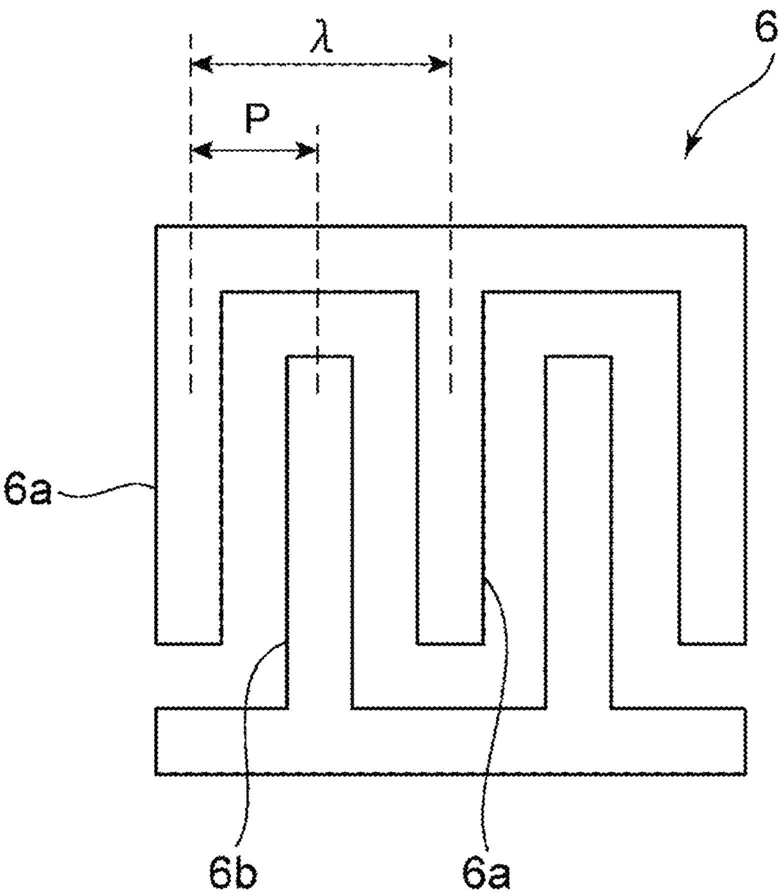
FIG. 2 is a plan view for explaining an electrode finger pitch P and a wavelength λ of an IDT electrode in the acoustic wave device according to the first preferred embodiment of the present invention.

As illustrated in FIG. 1B, the reflectors 7 and 8 are provided on both sides of the IDT electrode 6 in an acoustic wave propagation direction. Thus, a surface acoustic wave device that is, for example, a one-port acoustic wave resonator is configured. In the IDT electrode 6, first electrode fingers 6*a* and second electrode fingers 6*b* are interdigitated with each other. As illustrated in FIG. 2, a center-to-center distance between the first electrode finger 6*a* and the second electrode finger 6*b* is an electrode finger pitch P. When λ is a wavelength of an acoustic wave determined by an arrangement period of the first and second electrode fingers 6*a* and 6*b*, for example, λ=about 2 P is maintained.

The support substrate 2 is made of an appropriate insulating material, such as, for example, silicon, alumina, or quartz, or a semiconductor material.

The high acoustic velocity material layer 3 is made of a high acoustic velocity material in which an acoustic velocity of a bulk wave that propagates therethrough is higher than an acoustic velocity of an acoustic wave that propagates through the piezoelectric film 5. Examples of the high acoustic velocity material include, but are not particularly limited to, silicon, aluminum nitride, aluminum oxide, silicon nitride, silicon carbide, sapphire, lithium tantalate, lithium niobate, quartz, alumina, zirconia, cordierite, mullite, steatite, forsterite, magnesia, a diamond-like carbon (DLC) film or diamond, and a material including the above material as a main component. At least one selected from the group consisting of, for example, aluminum nitride, aluminum oxide, silicon nitride, and DLC is suitably used.

The low acoustic velocity material layer 4 is made of a low acoustic velocity material in which an acoustic velocity of a bulk wave that propagates therethrough is lower than an acoustic velocity of a bulk wave that propagates through the piezoelectric film 5. Examples of the low acoustic velocity material include, but are not particularly limited to, silicon oxide, silicon oxynitride, tantalum oxide, or glass, or a compound obtained by adding fluorine, carbon, or boron to silicon oxide. Alternatively, the low acoustic velocity material may include any material described above as a main component.

In the present preferred embodiment, the high acoustic velocity material layer 3 is made of, for example, silicon nitride, and the low acoustic velocity material layer 4 is made of, for example, silicon oxide.

The piezoelectric film 5 is made of, for example, $LiTaO_3$. However, the piezoelectric film 5 may be made of a piezoelectric material other than lithium tantalate, such as lithium niobate, for example.

The IDT electrode 6 and the reflectors 7 and 8 are made of an appropriate metal or alloy. The IDT electrode 6 and the reflectors 7 and 8 may include a multilayer body of metal films.

Figure 3:
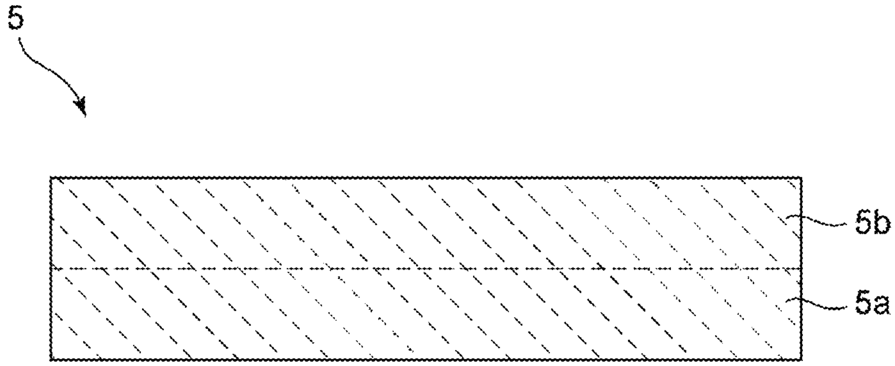
FIG. 3 is a front sectional view for explaining the structure of a piezoelectric film of the acoustic wave device according to the first preferred embodiment of the present invention.

As illustrated in FIG. 1A and FIG. 3, in the acoustic wave device 1, the piezoelectric film 5 includes a first region 5*a* and a second region 5*b* in a thickness direction. The second region 5*b* is located on a side of the IDT electrode 6.

The first region 5*a* and the second region 5*b* have different densities. That is, when the density of the first region 5*a* is a first density and the density of the second region 5*b* is a second density, the first density and the second density are different from each other. The first region 5*a* and the second region 5*b* having different densities can be formed by, for example, ion-implanting protons or the like into the piezoelectric film 5 to adjust a density of an ion-implanted region. Alternatively, the second region 5*b* may be formed as a film after the first region 5*a* is formed as a film. The first density and the second density can be made differently from each other by varying the film forming condition. In the present preferred embodiment, the first density is higher than the second density.

The densities of the first and second regions 5*a* and 5*b* of the piezoelectric film 5 can be obtained by a method of changing a distance between grids from an interstitial map obtained by using an X-ray or by determining a ratio of a part having a light color, that is, having a low density from a photograph of a section of the piezoelectric film 5 and comparing the ratio with that of a photograph of a single crystal.

The acoustic wave device 1 includes the first and second regions 5*a* and 5*b* that have different densities as described above and thus can reduce an out-of-band spurious response. It is considered that this is because the second region 5*b* having the relatively low density turns a high-order mode into a leaky mode, thus reducing the out-of-band spurious response. The presence of the first region 5*a* having the relatively high density divides a spurious response generated around 2.2 times a resonant frequency. Thus, it is possible to reduce the intensity of each spurious response individually, which also reduces the out-of-band spurious response.

Further, one of the first region 5*a* and the second region 5*b* preferably has, for example, a theoretical density of a piezoelectric single crystal. For example, in a case of a $LiTaO_3$ single crystal, a theoretical density is about $7.454\times 10^3$ ($kg/m^3$). In this case, the second region 5*b* on which the IDT electrode 6 is provided preferably has this theoretical density. In this case, good piezoelectricity is obtained.

However, both the density of the first region 5*a* and the density of the second region 5*b* may be higher or lower than the theoretical density.

Advantageous effects of the above acoustic wave device 1 will be clarified by describing Example 1 to Example 4 below.

Example 1

Example 1 was configured with the following design parameters.

The support substrate 2: a silicon substrate with a (111) plane, ψ=about 46°

The high acoustic velocity material layer 3: a SiN film, a film thickness of about 300 nm The low acoustic velocity material layer 4: a $SiO_2$ film, a film thickness of about 300 nm The piezoelectric film 5: about 55° Y-cut $LiTaO_3$. A film thickness of the first region 5*a*=about 200 nm, a film thickness of the second region 5*b*=about 200 nm The density of the first region 5*a*=about $7.454\times 10^3$ ($kg/m^3$); note that this value is equal to the theoretical density of $LiTaO_3$.

The density of the second region 5*b* was set to about 0.8 times the density of the first region 5*a*. Thus, the first density>the second density.

The IDT electrode 6 and the reflectors 7 and 8: a multi-layer body of a Ti film of about 12 nm thickness, an AlCu film of about 100 nm thickness, and a Ti film of about 4 nm thickness from a side of the piezoelectric film 5.

As a protective film, a silicon oxide film of about 35 nm thickness was provided so as to cover the IDT electrode 6 and the reflectors 7 and 8.

The wavelength λ determined by the electrode finger pitch P of the IDT electrode 6 was set to about 2 μm, and a duty was set to about 0.5.

For comparison, an acoustic wave device of Comparative Example 1 was configured in the same or substantially the same manner as Example 1, except that a $LiTaO_3$ film having a thickness of about 400 nm and a density of about $7.454 \times 10^3$ (kg/$m^3$) was used.

Figure 4:
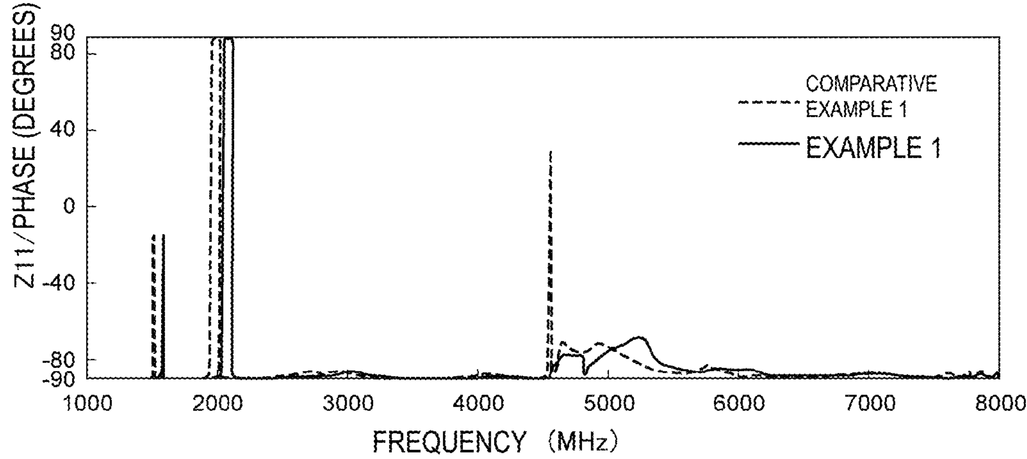
FIG. 4 is a graph showing phase-frequency characteristics of Example 1 and Comparative Example 1.

FIG. 4 shows phase-frequency characteristics of the acoustic wave devices of Example 1 and Comparative Example 1 described above. A solid line indicates the result of Example 1, and a broken line indicates the result of Comparative Example 1.

In the acoustic wave devices of Example 1 and Comparative Example 1 described above, a band between a resonant frequency and an anti-resonant frequency is present near 2000 MHz. Then, in Comparative Example 1, an out-of-band spurious response that seems to be caused by a high-order mode is notably present near 4600 MHz. On the other hand, it can be seen that this large spurious response is reduced or prevented in Example 1. It is considered that this is because the piezoelectric film 5 includes the first and second regions 5*a* and 5*b* that have different densities as described above, and thus the high-order mode is released as a leaky mode.

Example 2

As Example 2, an acoustic wave device having the following design parameters was configured.

The support substrate 2: a silicon substrate with a (111) plane, ψ=about 46°

The high acoustic velocity material layer 3: a SiN film, a film thickness of about 300 nm The low acoustic velocity material layer 4: a $SiO_2$ film, a film thickness of about 300 nm The piezoelectric film 5: about 55° Y-cut $LiTaO_3$. A film thickness of the first region 5*a*=about 200 nm, a film thickness of the second region 5*b*=about 200 nm The density of the first region 5*a* was set to about 0.8 times the density of the second region 5*b*.

The density of the second region 5*b*=about $7.454 \times 10^3$ (kg/$m^3$)

The IDT electrode 6 and the reflectors 7 and 8: a multi-layer body of a Ti film of about 12 nm thickness, an AlCu film of about 100 nm thickness, and a Ti film of about 4 nm thickness from a side of the piezoelectric film 5.

As a protective film, a silicon oxide film of about 35 nm thickness was provided so as to cover the IDT electrode 6 and the reflectors 7 and 8.

The wavelength λ determined by the electrode finger pitch P of the IDT electrode 6 was set to about 2 μm, and a duty was set to about 0.5.

In Example 2, the density of the second region 5*b* was set to about $7.454 \times 10^3$ (kg/$m^3$), and the density of the first region 5*a* was set to about 0.8 times the density of the second region 5*b*. Thus, the first density<the second density holds. The other configurations of Example 2 were set to be the same as or similar to those of Example 1.

Figure 5:
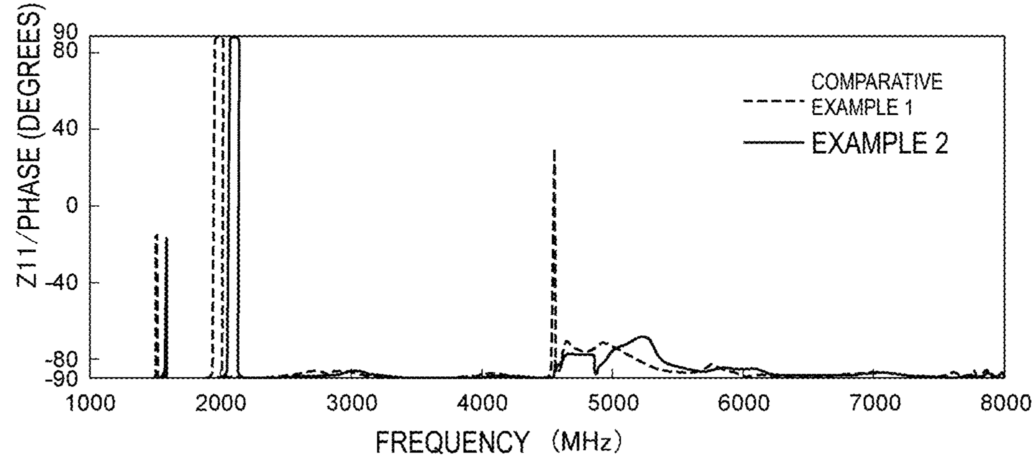
FIG. 5 is a graph showing phase-frequency characteristics of Example 2 and Comparative Example 1.

FIG. 5 shows phase-frequency characteristics of Example 2 and Comparative Example 1. A broken line indicates the result of Comparative Example 1, and a solid line indicates the result of Example 2.

As is clear from FIG. 5, also in Example 2, it is possible to effectively reduce or prevent a spurious response that seems to be caused by a high-order mode near about 4600 MHz.

Example 3

In the piezoelectric film 5, the second density of the second region 5*b* was set to about 1.1 times the first density of the first region 5*a*. With the other configurations set to be the same as or similar to those of Example 1, an acoustic wave device of Example 3 was configured. Thus, in Example 3, the first density<the second density holds.

Figure 6:
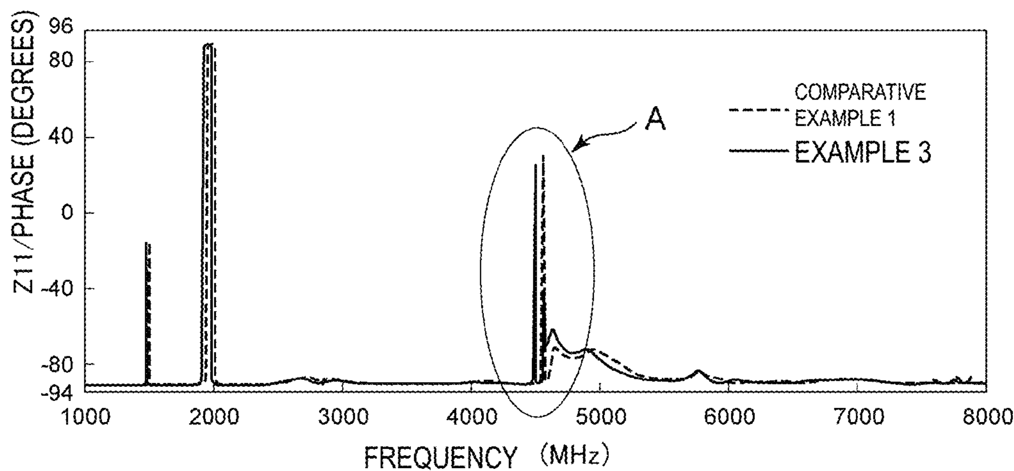
FIG. 6 is a graph showing phase-frequency characteristics of Example 3 and Comparative Example 1.
Figure 7:
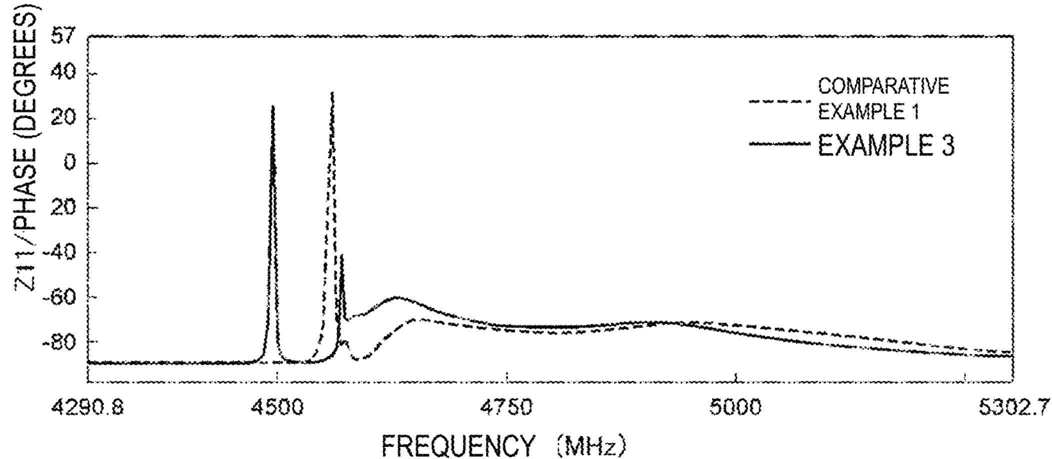
FIG. 7 is a graph showing phase-frequency characteristics in which a part indicated by an ellipse A in FIG. 6 is enlarged and illustrated.

FIG. 6 is a graph showing phase-frequency characteristics of Example 3 and Comparative Example 1. Further, FIG. 7 is a phase-frequency characteristic diagram in which a portion indicated by an ellipse A in FIG. 6 is enlarged and illustrated. A broken line indicates the result of Comparative Example 1, and a solid line indicates the result of Example 3.

As is clear from FIG. 6 and FIG. 7, near 4500 MHz to 4600 MHz, a large spurious response appears in Comparative Example 1, whereas two divided spurious responses appear in Example 3, and thus it can be seen that the intensity of the larger spurious response is smaller than the spurious response in Comparative Example 1. Thus, it can be seen that an out-of-band spurious response can be reduced or prevented also in Example 3, as compared with Comparative Example 1.

Example 4

The density of the second region 5*b* was set to about $7.454 \times 10^3$ (kg/$m^3$), and the density of the first region 5*a* was set to about 1.1 times the density of the second region 5*b*. That is, the first density>the second density holds.

With the other structure set to be the same as or similar to that of Example 1, an acoustic wave device of Example 4 was configured.

Figure 8:
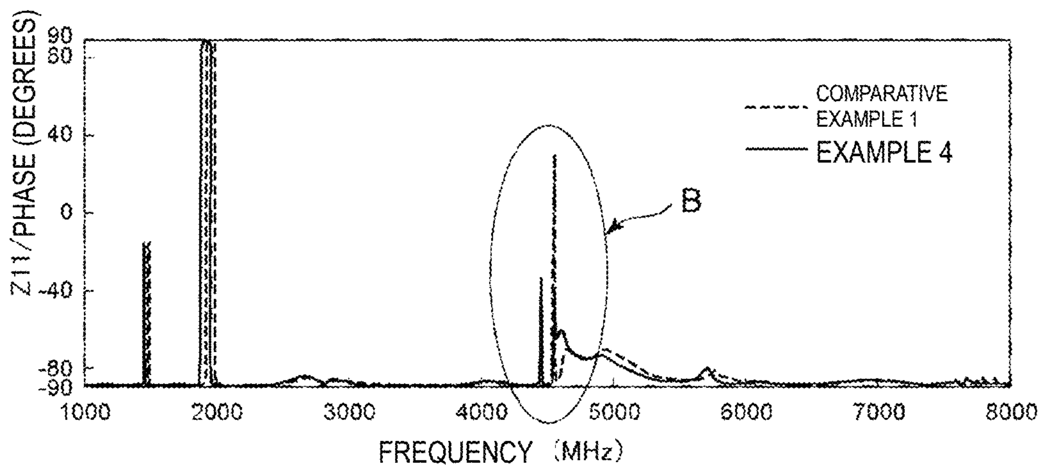
FIG. 8 is a graph showing phase-frequency characteristics of Example 4 and Comparative Example 1.
Figure 9:
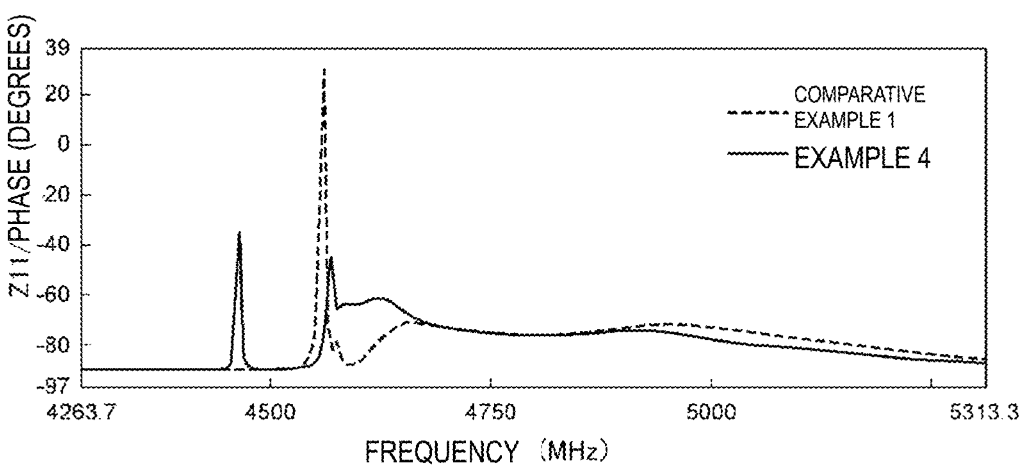
FIG. 9 is a graph showing phase-frequency characteristics in which a part indicated by an ellipse B in FIG. 8 is enlarged and illustrated.

FIG. 8 shows phase-frequency characteristics of Example 4 and Comparative Example 1, and FIG. 9 is a phase-frequency characteristic diagram in which a portion indicated by an ellipse B in FIG. 8 is enlarged and illustrated.

As is clear from FIG. 8 and FIG. 9, also in Example 4, a spurious response that appears near 4400 MHz to 4600 MHz and seems to be caused by a high-order mode is divided into two, and the intensity thereof is reduced. Thus, it can be seen that an out-of-band spurious response due to the high-order mode can be effectively reduced or prevented as compared with Comparative Example 1.

As is clear from the results of Examples 1 to 4 described above, in the acoustic wave device 1, the piezoelectric film 5 includes the first region 5*a* and the second region 5*b* that differ in density, and thus it is possible to reduce or prevent the out-of-band spurious response that seems to be caused by the high-order mode.

Example 5

In Example 5, the first density that is the density of the first region 5*a* was set to about $7.454 \times 10^3$ (kg/$m^3$), and the second density that is the density of the second region 5*b* was set to about 0.8 times the first density. Then, a total thickness of the first region 5*a* and the second region 5*b* was set to about 0.2λ=about 0.4 μm, and a thickness of the first region 5*a* was changed in a range from about 0.05 μm to about 0.35 μm in steps of about 0.05 μm. With the other configurations set to be the same as or similar to those of Example 1, acoustic wave devices that differ in the thicknesses of the first region 5*a* described above were configured.

Figure 10:
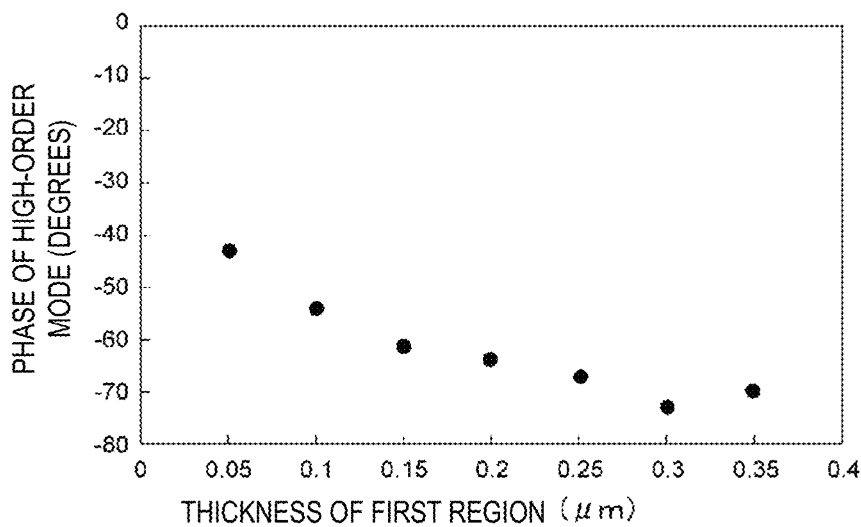
FIG. 10 is a graph showing a relationship between the thickness of a first region and the phase of a high-order mode.

FIG. 10 is a graph showing a relationship between the thickness of the first regions 5*a* and the obtained phase of a high-order mode in the acoustic wave devices in Example 5 described above.

As is clear from FIG. 10, it can be seen that as the thickness of the first region 5*a* increases, a spurious response of the high-order mode decreases. Preferably, the thickness of the first region 5*a* is equal to or greater than about 0.2 μm, that is, equal to or greater than about 0.11, and in this case, the high-order mode can be reduced or prevented more effectively.

Figure 11:
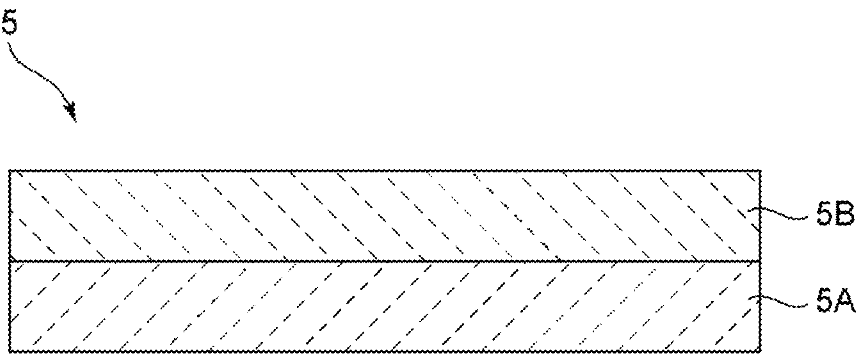
FIG. 11 is a front sectional view of a piezoelectric film in an acoustic wave device according to a second preferred embodiment of the present invention.

FIG. 11 is a front sectional view illustrating the piezoelectric film 5 in an acoustic wave device according to a second preferred embodiment of the present invention. In the second preferred embodiment, the piezoelectric film 5 includes a first piezoelectric film 5A and a second piezoelectric film 5B. As in such a case, in the present invention, the piezoelectric film 5 is not limited to including the first and second regions 5*a* and 5*b* that differ in density and may have a structure in which the first piezoelectric film 5A and the second piezoelectric film 5B are stacked. Also in this case, a density of the first piezoelectric film 5A is a first density, and a density of the second piezoelectric film 5B is a second density. Then, the second piezoelectric film 5B is located on a side of the IDT electrode.

Both the first piezoelectric film 5A and the second piezoelectric film 5B are made of piezoelectric materials of the same system. Here, as the piezoelectric materials of the same system, for example, a combination of a piezoelectric single crystal and a material obtained by adding an impurity to the piezoelectric single crystal or doping the piezoelectric single crystal with an impurity is conceivable. To give a more specific example, an example can be cited in which the first piezoelectric film 5A is formed of a material obtained by doping lithium tantalate with an impurity and lithium tantalate is used as the second piezoelectric film 5B.

Figure 12:
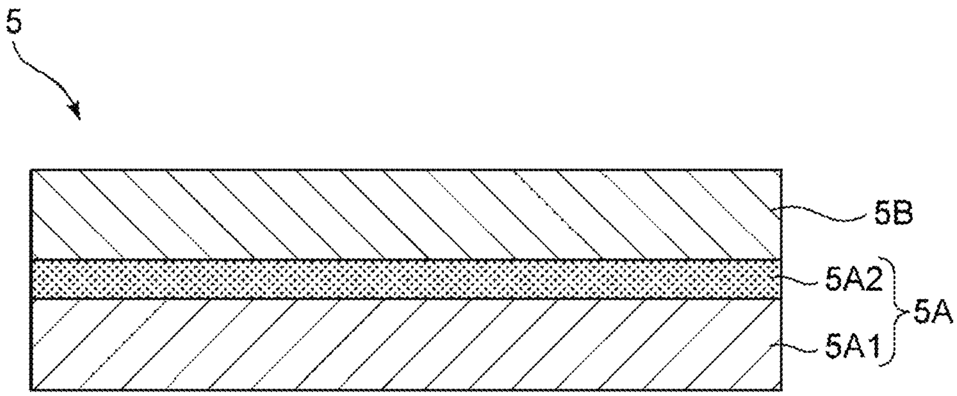
FIG. 12 is a front sectional view of a piezoelectric film in an acoustic wave device according to a third preferred embodiment of the present invention.

FIG. 12 is a front sectional view for explaining the piezoelectric film 5 in an acoustic wave device according to a third preferred embodiment of the present invention. In the third preferred embodiment, the piezoelectric film 5 includes the first piezoelectric film 5A and the second piezoelectric film 5B. Then, the first piezoelectric film 5A includes a first portion 5A1 and a second portion 5A2 stacked on the first portion 5A1. The first portion 5A1 is a low density region having a relatively low density, and the second portion 5A2 is a high density region having a density relatively higher than that of the first portion 5A1. That is, the second portion 5A2, which is the high density region, and the first portion 5A1, which is the low density region, are arranged along a thickness direction of the first piezoelectric film 5A. As described above, the first piezoelectric film 5A may include the regions having different densities. Such a structure can be obtained, for example, by forming the first portion 5A1 as a film and then implanting ions from one surface to provide the second portion 5A2. However, the method of forming the first and second portions 5A1 and 5A2 that differ in density is not particularly limited.

Further, although the first piezoelectric film 5A includes the portions 5A1 and 5A2 having different densities in FIG. 12, the second piezoelectric film 5B may be provided so as to include portions with different densities. Further, portions that differ in density may be provided in each of the first piezoelectric film 5A and the second piezoelectric film 5B. Further, the number of portions that differ in density may be three or more.

Further, the piezoelectric film 5 is not limited to the multilayer body of the first piezoelectric film and the second piezoelectric film and may have a structure in which a third piezoelectric film is laminated in addition to the first piezoelectric film and the second piezoelectric film.

Figure 13:
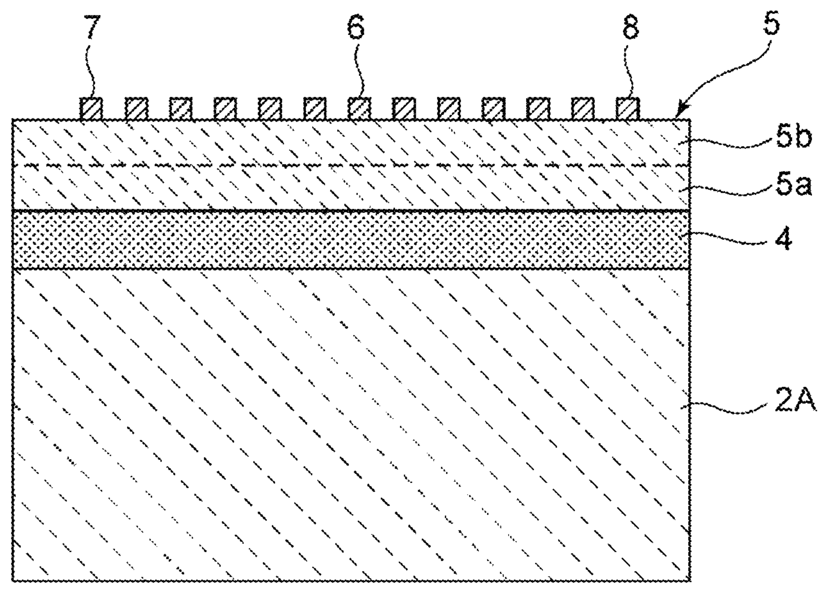
FIG. 13 is a front sectional view for explaining a modification of an acoustic wave device according to a preferred embodiment of the present invention.

Although the high acoustic velocity material layer 3 and the low acoustic velocity material layer 4 are stacked between the support substrate 2 and the piezoelectric film 5 in FIGS. 1A and 1B, a structure may be provided in which the low acoustic velocity material layer 4 is stacked between a high acoustic velocity support substrate 2A and the piezoelectric film 5, as in a modification of a preferred embodiment of the present invention illustrated in FIG. 13. The high acoustic velocity support substrate 2A is made of the above-described high acoustic velocity material. That is, the support substrate 2 and the high acoustic velocity material layer 3 illustrated in FIGS. 1A and 1B may be integrated with each other by using the high acoustic velocity material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a support substrate;

a piezoelectric film on the support substrate; and an IDT electrode on the piezoelectric film; wherein a film thickness of the piezoelectric film is, when A is a wavelength of an acoustic wave determined by an electrode finger period of the IDT electrode, equal to or less than about 1λ;

the piezoelectric film includes a first region and a second region in a thickness direction of the piezoelectric film; and when a density in the first region is a first density and a density in the second region is a second density, the first density and the second density are different from each other.

2. The acoustic wave device according to claim 1, wherein the second region is located closer to the IDT electrode than the first region; and the first density is lower than the second density.

3. The acoustic wave device according to claim 1, wherein the second region is located closer to the IDT electrode than the first region; and the second density is lower than the first density.

4. The acoustic wave device according to claim 1, wherein the piezoelectric film is made of lithium tantalate.

5. The acoustic wave device according to claim 1, wherein one of the first density and the second density is lower than about $7.454\times10^3$ (kg/m$^3$).

6. The acoustic wave device according to claim 1, wherein one of the first density and the second density is higher than about $7.454\times10^3$ (kg/m$^3$).

7. The acoustic wave device according to claim 1, wherein the piezoelectric film is made of lithium niobate.

8. The acoustic wave device according to claim 1, further comprising:

a high acoustic velocity material layer stacked between the support substrate and the piezoelectric film and made of a high acoustic velocity material in which an acoustic velocity of a bulk wave that propagates through the high acoustic velocity material is higher than an acoustic velocity of an acoustic wave that propagates through the piezoelectric film; and a low acoustic velocity material layer stacked between the high acoustic velocity material layer and the piezoelectric film and made of a low acoustic velocity material in which an acoustic velocity of a bulk wave that propagates through the low acoustic velocity material is lower than an acoustic velocity of a bulk wave that propagates through the piezoelectric film.

9. The acoustic wave device according to claim 8, wherein the high acoustic velocity material includes at least one of aluminum nitride, aluminum oxide, silicon nitride, and DLC; and the low acoustic velocity material is silicon oxide.

10. The acoustic wave device according to claim 8, wherein the support substrate and the high acoustic velocity material layer define an integrated high acoustic velocity support substrate made of the high acoustic velocity material.

11. An acoustic wave device, comprising:

a support substrate;

a piezoelectric film on the support substrate; and an IDT electrode on the piezoelectric film; wherein a film thickness of the piezoelectric film is equal to or less than about 1λ when λ is a wavelength of an acoustic wave determined by an electrode finger period of the IDT electrode;

the piezoelectric film includes a first piezoelectric film and a second piezoelectric film stacked directly or indirectly on the first piezoelectric film;

the first piezoelectric film and the second piezoelectric film are made of piezoelectric materials of a same system; and when a density of the first piezoelectric film is a first density and a density of the second piezoelectric film is a second density, the first density and the second density are different from each other.

12. The acoustic wave device according to claim 11, wherein the second piezoelectric film is located closer to the IDT electrode than the first piezoelectric film; and a film thickness of the first piezoelectric film is larger than a film thickness of the second piezoelectric film.

13. The acoustic wave device according to claim 11, wherein the first piezoelectric film or the second piezoelectric film includes a high density region having a relatively high density and a low density region having a relatively low density; and the high density region and the low density region are located along a thickness direction of the first piezoelectric film or the second piezoelectric film.

14. The acoustic wave device according to claim 11, wherein the second piezoelectric film is located closer to the IDT electrode than the first piezoelectric film; and the first density is lower than the second density.

15. The acoustic wave device according to claim 11, wherein the second piezoelectric film is located closer to the IDT electrode than the first piezoelectric film; and the second density is lower than the first density.

16. The acoustic wave device according to claim 11, wherein the piezoelectric film is made of lithium tantalate.

17. The acoustic wave device according to claim 11, wherein one of the first density and the second density is lower than about $7.454\times10^3$ (kg/m$^3$).

18. The acoustic wave device according to claim 11, wherein one of the first density and the second density is higher than about $7.454\times10^3$ (kg/m$^3$).

19. The acoustic wave device according to claim 11, wherein the piezoelectric film is made of lithium niobate.

20. The acoustic wave device according to claim 11, further comprising:

a high acoustic velocity material layer stacked between the support substrate and the piezoelectric film and made of a high acoustic velocity material in which an acoustic velocity of a bulk wave that propagates through the high acoustic velocity material is higher than an acoustic velocity of an acoustic wave that propagates through the piezoelectric film; and a low acoustic velocity material layer stacked between the high acoustic velocity material layer and the piezoelectric film and made of a low acoustic velocity material in which an acoustic velocity of a bulk wave that propagates through the low acoustic velocity material is lower than an acoustic velocity of a bulk wave that propagates through the piezoelectric film.

* * * * *